United States Patent
Gallentine

(12) 
(10) Patent No.: US 7,355,377 B1
(45) Date of Patent: Apr. 8, 2008

(54) TELESCOPING ELECTRICAL TESTER

(76) Inventor: Bill Gallentine, 615 Country Club Rd., Hood River, OR (US) 97031

( * ) Notice: Subject to any disclaimer, the term of this patent is extended or adjusted under 35 U.S.C. 154(b) by 0 days.

(21) Appl. No.: 11/581,982

(22) Filed: Oct. 17, 2006

(51) Int. Cl.
*G01R 31/02* (2006.01)

(52) U.S. Cl. .................................................. 324/72.5

(58) Field of Classification Search ............ 324/76.11, 324/72.5, 506–508, 149; 439/759
See application file for complete search history.

(56) References Cited

U.S. PATENT DOCUMENTS

| | | | |
|---|---|---|---|
| 3,201,746 A | | 8/1965 | Askew |
| 3,864,629 A | | 2/1975 | Danna |
| 3,996,511 A | * | 12/1976 | Baer .......................... 324/556 |
| 5,416,405 A | * | 5/1995 | Dill ............................ 324/72.5 |
| 6,433,530 B1 | * | 8/2002 | Pool .......................... 324/72.5 |

* cited by examiner

*Primary Examiner*—Ha Tran Nguyen
*Assistant Examiner*—Roberto Velez
(74) *Attorney, Agent, or Firm*—Maxine Barasch & Associates, PLLC; David L. Banner

(57) ABSTRACT

A probe-type electrical tester having a lamp, a first pointed electrode connected to the lamp, and a second electrode comprising an alligator clip connected to the lamp.

The pointed electrode occupies a sleeve which is telescopingly stored within the tester. The sleeve terminates in a hook shaped guard for receiving jacketed conductors to be held during testing and to prevent injury from the pointed electrode. The sleeve is manually extended. A lever then causes the pointed electrode to advance within the sleeve after the sleeve has reached the fully projected position, to enable piercing of the jacket of the jacketed conductor being tested. A detent holds the lever in the fully projected position, and the sleeve in its projected position. The sleeve prevented from escaping from the tester. When the pointed electrode is retracted, the lever can also be substantially retracted into the tester body.

13 Claims, 3 Drawing Sheets

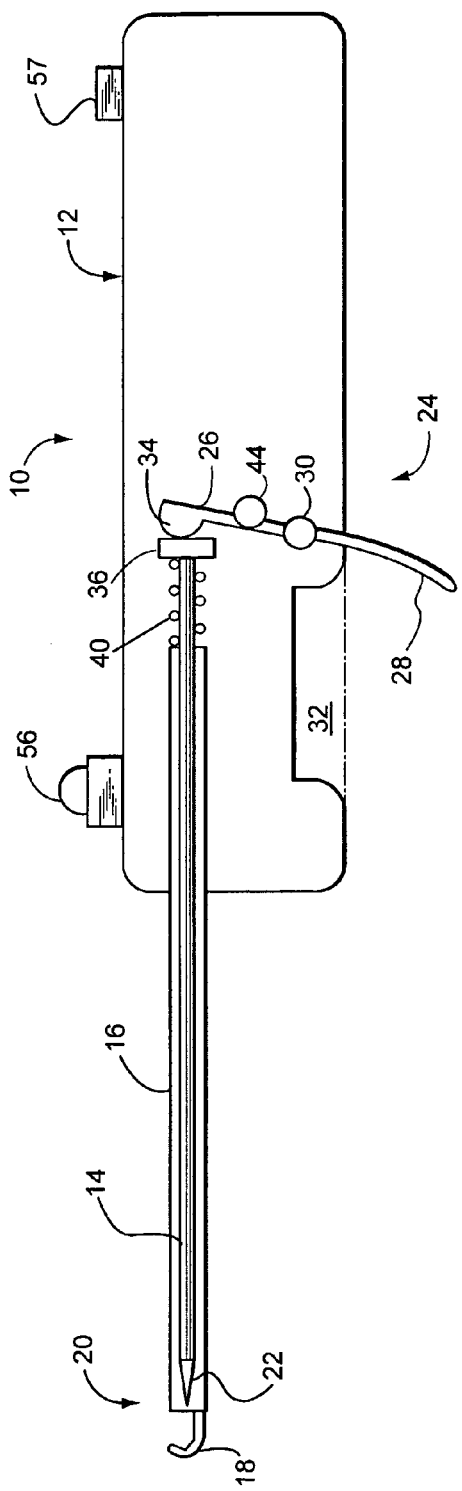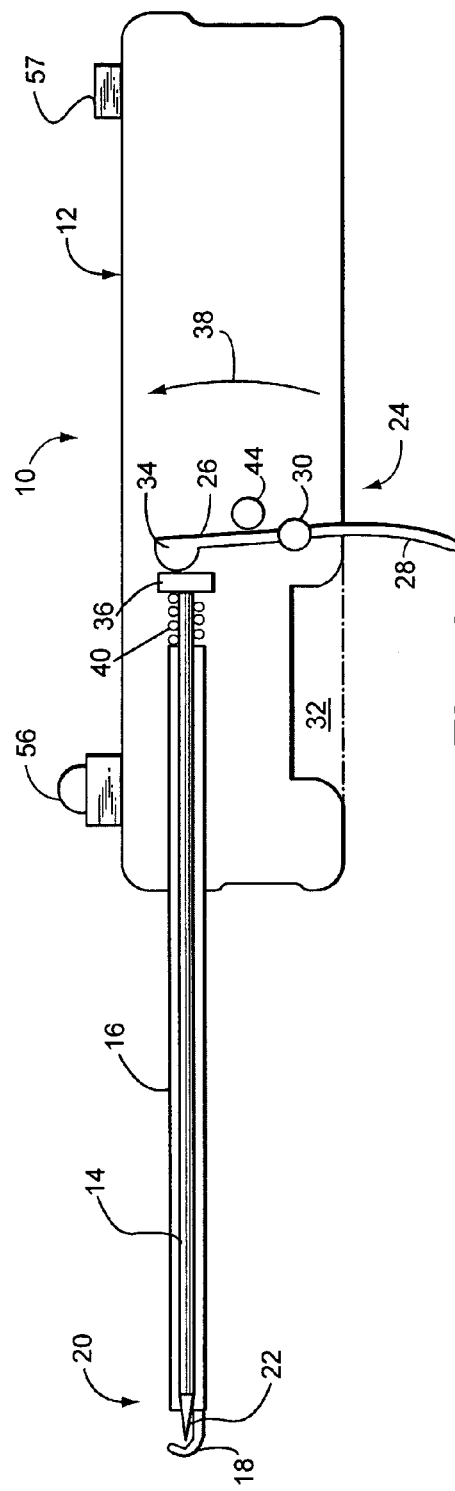

TELESCOPING ELECTRICAL TESTER

FIELD OF THE INVENTION

The present invention relates to electrical voltage testing apparatus, and more particularly to a telescoping probe-type voltage testers that illuminate a lamp upon completing a circuit when a sufficient voltage potential is present.

BACKGROUND OF THE INVENTION

The prior art has proposed probe-type electrical testers for determining presence of voltage in low powered circuits. An illustrative application in which such probe-type testers have long been commercially available is that of automotive electrical systems. These systems are of the direct current type and typically operate at a nominal voltage of twelve volts. Actual voltage, which may be provided for example by a vehicular AC generator or alternator, rarely exceed sixteen volts.

In trouble shooting vehicle electrical systems, a frequent step is that of determining if exposed metallic components and insulated conductors are energized. This is quickly and easily accomplished using a probe-type tester. The probe tester includes a first electrode which typically terminates in a sharp point which may either be rested on exposed metallic components, or forced to penetrate conductor insulation such that the probe, which is conductive, contacts the inner conductor being tested. The probe includes a lamp and a second electrode typically in the form of a flexible conductor terminating in a so-called "alligator clip", which is a two-jawed clamp having a spring disposed to urge the jaws together. The probe-type tester is arranged such that the first electrode, the lamp, and the second electrode are disposed electrically in series. The alligator clip is typically fixed to a grounded portion of a vehicle. The sharp probe then is placed against an object being tested. Should the object being tested be energized, the lamp will illuminate, thus signaling the energized status thereof. The above apparatus and procedure are well known.

While existing probe testers work well, they suffer from certain practical deficiencies. For one, the probe point is usually exposed. As the probe point is typically sharp, an obvious hazard exists. Another deficiency is that testers of the prior art are fairly small and delicate, compared to other automotive tools such as wrenches and the like. In addition they are sufficiently long as to be slightly unwieldy. There is no convenient way of carrying a typical probe tester in ordinary use that is both safe and practical.

Some people carry probe testers in shirt pockets. The length of the typical tester is such that it is prone to falling from a shirt pocket. Because of its delicate nature, it can be damaged if stored with heavy steel tools or the like. And there remains the problem of protecting people and possessions from the sharp point of the probe.

DISCUSSION OF THE RELATED ART

U.S. Pat. No. 3,864,629, issued to Danna on Feb. 4, 1975, shows a tester configured in the manner of a pocket pen, having a hook type wire guard. The subject tester lacks the probe projection and retraction feature of the present invention.

U.S. Pat. No. 3,201,746, issued to Askew on Aug. 17, 1965, shows a pen type tester having a pocket clip. The device of Askew has only limited telescoping ability, and also lacks the projection and retraction feature of the present invention.

The prior art remains in need of a more practical type electrical probe tester.

SUMMARY OF THE INVENTION

The present invention answers the above stated need by providing an electrical probe tester which is compact and which when not in use, shields the sharp point of the probe, while still offering the usual useful attributes of this class of tool. The novel probe tester can be carried about in a shirt pocket in its retracted state without being prone to falling.

The novel probe tester is telescoping in that the pointed probe and a surrounding sleeve retract into the handle of the tester. They are readily urged into a projecting position for use, and thereafter, readily retracted. The probe is advanced further once the sleeve reaches its final projected position using a lever which in many ways resembles the trigger of a firearm. This lever secures the probe in the projected or extended position.

The probe is housed in a surrounding sleeve terminating in a hook-shaped guard which covers the point of the probe. The sleeve and probe are both projected and retracted as a unit. Only the final increment of projection of the probe is performed by the lever.

It is one object of the invention to provide a telescoping electrical probe electrical tester.

It is an object of the invention to facilitate extension and retraction of the probe in a probe-type electrical tester.

A further object of the invention is to provide a practical, way of extending and retracting the probe which is easily performed.

It is another object of the invention to provide a selectively removable guard over the sharp point of the probe.

It is an object of the invention to provide improved elements and arrangements thereof by apparatus for the purposes described which is inexpensive, dependable, and fully effective in accomplishing its intended purposes.

These and other objects of the present invention will become readily apparent upon further review of the following specification and drawings.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein:

FIG. 3 is similar to FIG. 2, but shows a manual operator positioned to propel a probe forwardly within the protective sleeve.

FIG. 4 is similar to FIG. 3, but shows the manual operator advancing the probe to a maximally extended position.

DETAILED DESCRIPTION OF THE PREFERRED EMBODIMENTS

Figure 1:
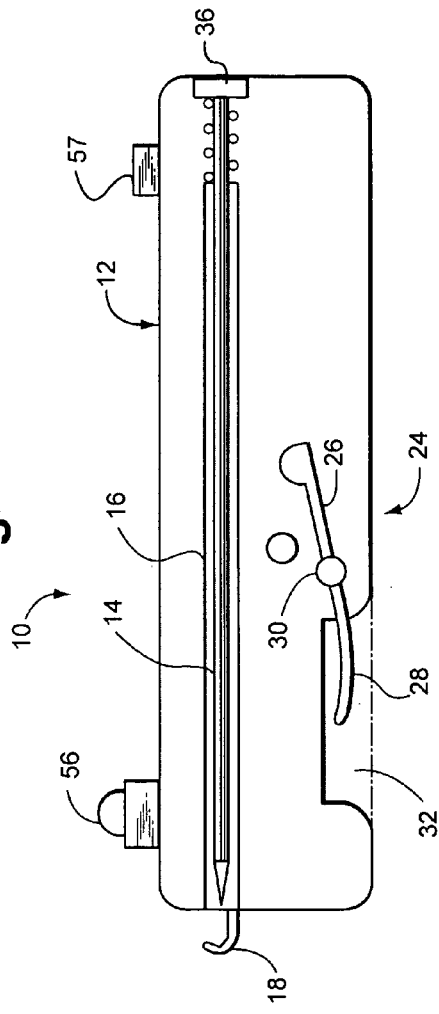
FIG. 1 is a side elevational view of one embodiment of the invention, partially broken away to reveal internal detail, and with some details omitted for clarity of the view. The novel electrical tester is shown in its most compact configuration.

FIG. 1 of the drawings shows an electrical tester 10 of the extensible probe-type, comprising a body 12 serving both as a handle and also as a housing which encloses and supports in appropriate location operable components. A first electrode in the form of elongated pointed probe 14 is supported within body 12 in a manner enabling selective projection and retraction of elongated probe 14 to a deployed position (see FIG. 2) wherein elongated probe 14 projects from body 12 and to the stowed position shown in FIG. 1 wherein elongated probe 14 is retracted substantially into body 12. A sleeve 16 surrounds elongated probe 14 and contains elongated probe 14 therein.

Figure 2:
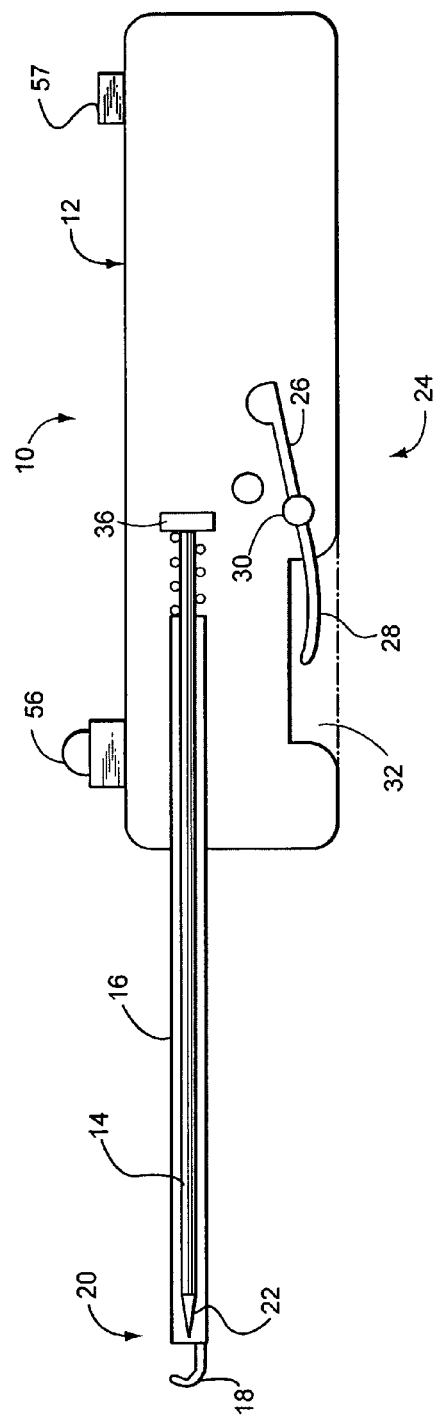
FIG. 2 is similar to FIG. 1, but shows a testing probe and its surrounding protective sleeve withdrawn and extending from the electrical tester. In the depiction of FIG. 2, the sleeve is fully extended but the probe is not.

Turning now to FIG. 2, sleeve 16 and elongated probe 14 are shown in a projected position. Movement to a projected position is accomplished manually by grasping sleeve 16 or its associated guard 18 which is disposed on sleeve 16 at a distal end 20 thereof. When extended, sleeve 16 containing probe 14 projects beyond body 12 at least 50% of the length of body 12. The purpose of guard 18 is to limit outward projection of elongated probe 14 by direct interference therewith. Otherwise, the sharp point 22 of elongated probe 14 could possibly cause injury to those utilizing electrical tester 10. Sharp point 22 is sufficiently sharp as to be able to penetrate elastomeric jacketing (i.e., insulation) of commercial wires and cables. Guard 18 is preferably V-shaped, so as to provide a convenient seat for placing cables or jacketed electrical conductors (none shown) in a fixed location suitably aligned with sharp point 22 so that sharp point 22 will contact the center of the cable thereby assuring contact with the central conductor. This is a well known procedure which has been practiced with prior art testers of the same general type.

When it comes time to actually pierce an insulated conductor, the conductor is placed in guard 18 and elongated probe is further advanced to the projected position towards the insulated conductor, as shown in FIG. 4. This is accomplished by a lever mechanism 24 which includes a lever 26 and a manually operated actuating arm 28. Lever mechanism 24 is disposed to advance elongated probe 14 in the projected direction beyond the point at which sleeve 16 has been stopped from further projection. Lever mechanism 24 includes a trunnion bearing 54 to which lever 26 and actuating arm 28 are fixed. Trunnion bearing 54 is suitably supported in journaled fashion within body 12 to assure that lever mechanism 24 be pivotally supported on and fixed to body 12.

FIGS. 1 and 2 show lever mechanism 24 in a stowed position in which actuating arm 28 is retracted fully within the perimeter of body 12 for stowage when elongated probe 14 is in its stowed position. The perimeter of body 12 encompasses the outer bounds of body 12, as seen in FIGS. 1-4, and also a broken projection line which completes the generally parallelepiped profile of body 12 as seen in FIGS. 1-4. Of course, it is not important that body 12 literally display a parallelepiped configuration, provided that the actual configuration be suitable for manual grasp and ready placement in a shirt pocket (not shown), drawers and trays of tool storage containers, and other locations which are typically encountered in the working environment. Reference to a parallelepiped is merely a semantic convenience to emphasize the retracted location of actuating arm 28 to a point that it will not readily snag on clothing, fingers, and other environmental elements (none shown) which could possibly unintendedly pull actuating arm 28 into a deployed position. The preferred configuration of body 12 could include, for example, relatively streamlined handles typical of many hand tools, such as wrenches, hammers, knives, and the like.

In the stowed position within recess 32, actuating arm 28 is beyond ready access to snagging, yet is accessible to manual contact so that actuating arm 28 may be operably manipulated.

Operation will now be described. With elongated probe 14 and sleeve 16 extended into the deployed position seen in FIG. 2, actuating arm 28 is grasped and moved first to the point that enlarged head 34 of lever 26 contacts elongated probe 14. In the embodiment of FIGS. 1-4, this contact occurs at enlarged terminal 36 of elongated probe 14. Actuating arm 28 is then further rotated in the direction indicated by arrow 38 (see FIG. 4). This may be performed by grasping actuating arm 28 and moving it in the manner of operating the trigger of a firearm (not shown).

Elongated probe 14 is moved to the left, as seen in FIGS. 3 and 4, responsively to lever 26 until pointed end 22 is exposed and approaches guard 18 (see FIG. 4). This action compresses a coil spring 40, the function of which is to urge elongated probe towards the retracted or stowed position within sleeve 16. This is an expedient to assure that pointed end 22 not either interfere with placement of a wire or cable within guard 18, and also as a safety precaution to prevent inadvertent pricking of the hand of a user.

In summary, lever mechanism 24 disposed to advance elongated probe 14 in the projected direction after sleeve 16 has been stopped from further projection.

In a preferred embodiment, electrical tester 10 has a feature for assuring that elongated probe 14 be maintained in the fully projected position shown in FIG. 4. To this end, a detent mechanism is provided which imposes an interference to return of lever 26 counter to arrow 38 (see FIG. 4). An exemplary arrangement of the detent mechanism is shown with reference to FIG. 5.

Figure 5:
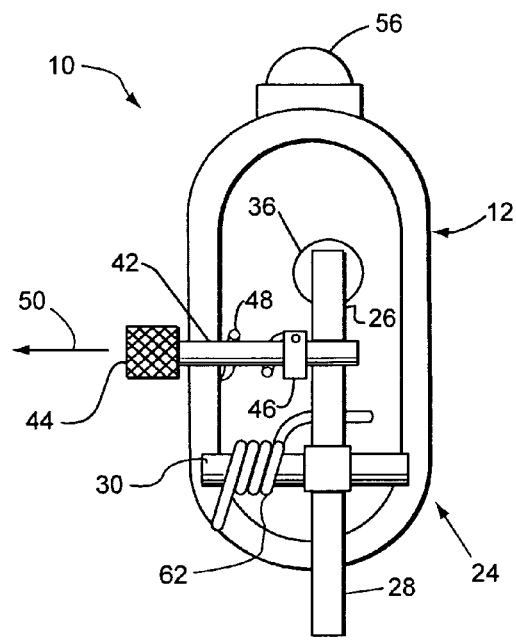
FIG. 5 is an end elevational view of FIG. 3, partially broken away to reveal internal detail, of an electrical tester according to a further embodiment of the invention.

In FIG. 5, a pin 42 is slidably supported within body 12. Pin 42 has an enlarged knurled head 44 for grasping, a flange 46, and is partially encircled by a coil spring 48. Pin 42 is shown near the limits of travel to the right, as seen in FIG. 5, whereat pin 42 assumes a position immediately behind lever 26. This situation is reflected in FIG. 3, where it will become apparent that lever 26 is entrapped between enlarged terminal 36 and pin 42. Slight further movement of actuating arm 28 to the deployed position will relieve this entrapment, thereby enabling spring 48 to urge pin 42 in the direction of arrow 50 (see FIG. 5). Thus, the detent feature has a further automatic release feature responsive to manipulation of actuating arm 28. Pin 42 is initially moved to its interfering position by manually pressing on knurled head 44 after lever 26 has been moved to a position enabling pin 42 to pass immediately behind it, as seen in FIG. 3.

FIG. 5 also shows a feature of the invention which automatically returns actuating arm 28 to the retracted position seen in FIGS. 1 and 2 when pin 42 has been released. A coil return spring 62 is supported on trunnion 54 in a manner such that it urges lever 26 to pivot in a direction counter to arrow 38 (FIG. 4). Consequently, actuating arm 28 is automatically retracted at least substantially within the perimeter of body 12 for stowage when elongated probe 14 is in its stowed position. Return spring 62 may be omitted in favor of relying on manual retraction of sleeve 16 into body 12 if desired. In embodiments without return spring 62, retraction is accomplished by merely placing the palm of the user's hand against guard 18 and exerting inward pressure thereupon. In response to pressure on guard 18, sleeve 16 with probe 14 are pushed into the body 12 and trigger 28 is swung out-of-sight into a recess in body 12.

Figure 6:
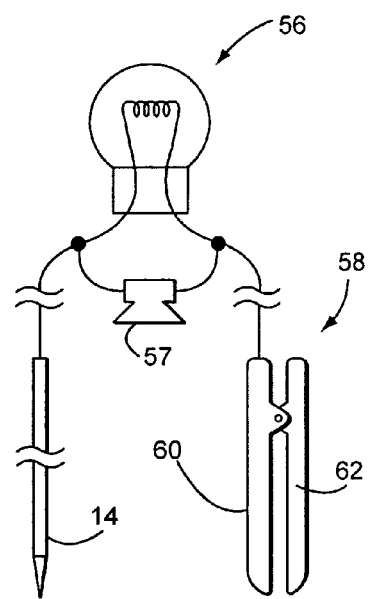
FIG. 6 is a diagrammatic rendition of probes and indicator according to one embodiment of the invention.

Referring now to FIG. 6, electrical tester 10 has an electrically powered indicator disposed to indicate presence of a predetermined voltage potential existing between a first electrode (i.e., elongated probe 14) and a second electrode. The electrically powered indicator is preferably a lamp 56. The second electrode preferably takes the form of an alligator clip 58 of well known type having two jaws 60, 62 which are disposed in pivotal relationship to one another such that jaws 60, 62 can close over an environmental object (not shown). Preferably, alligator clip 58 includes a spring (not shown) which urges jaws 60, 62 to close, as is well known in the art.

It will be recognized that terminations other than alligator clip 58 may be used to meet a particular operating circumstance or environment. Consequently, the invention is not limited to an alligator clip termination but covers any and all other suitable terminations.

Electrical tester 10 includes suitable circuitry which connects elongated probe 14, lamp 56, and alligator clip 58 electrically in series as shown representatively in FIG. 6.

There may occur times when lamp 56 is not visible to the user of electrical tester 10. For this reason, it is possible to add a sound generating device, for example a buzzer 57 parallel to lamp 56. In alternate embodiments, buzzer 57 may replace lamp 56.

Figure 7:
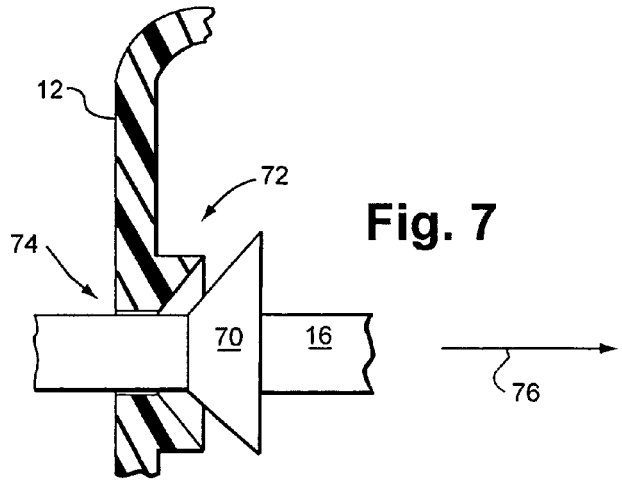
FIG. 7 is a partial cross sectional, enlarged detailed view of the upper left of FIG. 1.

FIG. 7 shows a stop formed in body 12, the function of which is to retain sleeve 16 to body 12 when sleeve 16 is in the deployed position shown in FIGS. 2, 3, and 4. The stop is collectively provided by a swaged flange 70 formed in sleeve 16, which interferingly interacts with a corresponding swaged structure 72 formed in the wall of body 12. While interfering elements having, for example, parallel walls (not shown) could be substituted for the swaged arrangement depicted in FIG. 7, it will be appreciated that the arrangement of FIG. 7 promotes centering of sleeve 16 within the opening 74 formed in body 12 which passes sleeve 16 to the exterior during deployment. Arrow 76 shows the direction of retraction.

The present invention is susceptible to modifications and variations from the embodiments described hereinabove. For example, although electrical connection of the electrodes and lamp 56 has been presented as incorporating jacketed wires or cables, it would be possible to provide body 12 with a conductive metallic rail which faces elongated probe 14, and to provide elongated probe 14 with a conductive metal finger which slidingly engages the rail (this embodiment is not shown). Also, it would be possible to connect lamp 56 to sleeve 16 rather than to elongated probe 14, as both probe 14 and sleeve 16 are preferably conductive, e.g., metallic, and in electrical contact with one another. As a consequence, it is possible to test exposed energized conductors by touching them with hook 18 or sleeve 16 as well as with by the piercing method.

Engagement of probe 14 at enlarged terminal 36 may be modified to incorporate a yoke (not shown) or other structure for assuring engagement of probe 14 by lever mechanism 24. Such an embodiment would assure that actuating arm 28 may be employed to project and withdraw probe 14 and sleeve 16. It should be stressed that lever mechanism 24 can prevent withdrawal or retraction of sleeve 14 into body 12 by finger pressure, to enable maneuvering hook 18 through bundles of cables (not shown), which maneuvering might otherwise cause unintended retraction of sleeve 16.

Connection and anchorage of springs, where shown, is not limited to the actual depictions. It will be noted that spring 40 (FIG. 3) is entrapped between terminal 36 and the proximal end of sleeve 16. Spring 48 (FIG. 5) is embedded within a wall of body 12 at one end and is embedded in flange 46 at the other end. Spring 52 is embedded in one end and free at the other. Obviously, other arrangements which would enable the respective springs to perform their functions as described would be satisfactory.

Walls and other structures of body 12 may be altered to increase or otherwise modify support and engagement of components of electrical tester 10.

Pin 42, which interferes with pivoting of lever 26, may be replaced by a pivoting member, not shown, which moves into and out from a position of interference with respect to lever 26 to the same effect.

Springs, where shown, may take forms other than that of coils springs, and whether of coil type or other, may be arranged differently from the described arrangements.

Any portion of lever arrangement 24 and any part of the detent mechanism which acts on lever arrangement 24 may be provided with an alternative to solid members and springs. For example, pin 42 or its equivalent, or lever 26 or any part fixed thereto may be received in a resilient member, or may be subjected to friction fit to inhibit undesired movement.

Guard 18 or sleeve 16 may be conductive, to permit voltage sensing without using elongated probe 14, with suitable modification to assure electrical continuity, if desired.

The exterior contour of body 12 may be modified to provide an ergonomically correct fit in a user's hand. Broken lines 64 as seen in FIG. 4 indicate possible body contours. It will be recognized that many other possible body contours also exist.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An extensible probe electrical tester, comprising:
   a) an elongated body having the general form of a rectangular parallelepiped having a major axis, said parallelepiped having a length along said major axis allowing containment of said parallelepiped within a breast pocket of a garment;
   b) an elongated sleeve slidably supported within said body, said sleeve being manually movable between a deployed position wherein said sleeve projects from said body a distance of at least 50% of said length along said major axis of said parallelepiped, and a stowed position whereat said probe is retracted substantially into said body;
   c) means for retaining said sleeve within said body when said sleeve is in said deployed position;
   d) an elongated probe slidably contained within said elongated sleeve and selectively movable therein, said elongated probe forming a first electrode;

e) a mechanism comprising a lever and an actuating arm disposed substantially within said body and adapted for manual contact, said lever mechanism being disposed to further advance said elongated probe within said sleeve from a retracted position to a projected position when said sleeve is disposed in said deployed position;

f) a second electrode; and g) means for indicating a voltage electrically connected to said first electrode and said second electrode.

2. The electrical tester according to claim 1, wherein said lever mechanism is pivotally supported on and fixed to said body.

3. The electrical tester according to claim 1, wherein said actuating arm is movable to retract substantially within the perimeter of said body for stowage when said sleeve and said first electrode are in said stowed position.

4. The electrical tester according to claim 1, further comprising a spring disposed to urge said first electrode towards said retracted position within said sleeve.

5. The electrical tester according to claim 1, further comprising a guard disposed on said sleeve proximate said distal end thereof, said guard being disposed to limit outward projection of said first electrode.

6. The electrical tester according to claim 1, further comprising a detent mechanism disposed to maintain said lever of said lever mechanism in a position to maintain said probe in said projected position.

7. The electrical tester according to claim 1, wherein said means for indicating a voltage comprises at least one of the group: a visual indicator, and a sound generating device.

8. The electrical tester according to claim 7, wherein said sound generating device comprises a buzzer.

9. The electrical tester according to claim 7, wherein said visual indicator comprises a lamp.

10. The electrical tester according to claim 1, wherein said first electrode has a point disposed at its distal end, said point being sufficiently sharp as to be able to penetrate elastomeric jacketing of an insulated conductor.

11. The electrical tester according to claim 1, wherein said second electrode comprises two jaws which are disposed in pivotal relationship to one another such that said two jaws can close over an environmental object.

12. The electrical tester according to claim 1, wherein said means for retaining said sleeve comprises a stop formed in said body.

13. The electrical tester according to claim 1, wherein said body comprises a handle.

\* \* \* \* \*